(12) United States Patent
Osawa et al.

(10) Patent No.: US 9,233,538 B2
(45) Date of Patent: Jan. 12, 2016

(54) PIEZOELECTRIC DEVICE, PIEZOELECTRIC ACTUATOR, DROPLET EJECTING HEAD, AND DROPLET EJECTING APPARATUS

(75) Inventors: Eiji Osawa, Chiho (JP); Koji Ohashi, Matsumoto (JP); Eiju Hirai, Minamiminowa-mura (JP)

(73) Assignee: Seiko Epson Corporation, Tokyo (JP)

( * ) Notice: Subject to any disclaimer, the term of this patent is extended or adjusted under 35 U.S.C. 154(b) by 807 days.

(21) Appl. No.: 12/968,890

(22) Filed: Dec. 15, 2010

(65) Prior Publication Data
US 2011/0141200 A1    Jun. 16, 2011

(30) Foreign Application Priority Data

Dec. 15, 2009   (JP) ................... 2009-283818

(51) Int. Cl.
| | |
|---|---|
| B41J 2/045 | (2006.01) |
| B41J 2/14 | (2006.01) |
| H01L 41/047 | (2006.01) |
| H01L 41/09 | (2006.01) |

(52) U.S. Cl.
CPC .......... B41J 2/14233 (2013.01); B41J 2/14201 (2013.01); H01L 41/047 (2013.01); H01L 41/0973 (2013.01)

(58) Field of Classification Search
CPC .... B41J 2/135; B41J 2/14201; B41J 2/14274; H01L 41/0926; H01L 41/047; H01L 41/083; H01L 41/39; H01L 41/0472; H01L 41/107

USPC ...................... 347/68; 310/311, 340
See application file for complete search history.

(56) References Cited

U.S. PATENT DOCUMENTS

| | | | |
|---|---|---|---|
| 6,336,717 B1 | 1/2002 | Shimada et al. | |
| 7,268,472 B2 * | 9/2007 | Higuchi et al. | 310/365 |
| 7,364,273 B2 * | 4/2008 | Takahashi | 347/68 |
| 7,843,113 B2 * | 11/2010 | Wijngaards et al. | 310/320 |
| 7,958,608 B2 * | 6/2011 | Fujii et al. | 29/25.35 |
| 2002/0179947 A1 | 12/2002 | Nasu et al. | |
| 2006/0208618 A1 * | 9/2006 | Murai et al. | 310/363 |
| 2009/0066763 A1 * | 3/2009 | Fujii et al. | 347/68 |

FOREIGN PATENT DOCUMENTS

| | | |
|---|---|---|
| JP | 2000-326503 A | 11/2000 |
| JP | 2003-051583 | 2/2003 |
| JP | 2006-245247 | 9/2006 |
| JP | 2006-245383 | 9/2006 |

* cited by examiner

*Primary Examiner* — Geoffrey Mruk
(74) *Attorney, Agent, or Firm* — Workman Nydegger

(57) ABSTRACT

A piezoelectric device including: a first electrode layer provided so as to overlie a substrate; a second electrode layer disposed so as to face the first electrode layer; and a piezoelectric layer disposed between the first electrode layer and the second electrode layer. The first electrode layer has a conductive layer and a barrier layer. The barrier layer is provided between the conductive layer and the piezoelectric layer so as to prevent the conductive layer from contacting the piezoelectric layer.

12 Claims, 8 Drawing Sheets

PIEZOELECTRIC DEVICE, PIEZOELECTRIC ACTUATOR, DROPLET EJECTING HEAD, AND DROPLET EJECTING APPARATUS

This application claims a priority to Japanese Patent Application No. 2009-283818 filed on Dec. 15, 2009 which is hereby expressly incorporated by reference herein in its entirety.

BACKGROUND

1. Technical Field

The present invention relates to a piezoelectric device, a piezoelectric actuator, a droplet ejecting head, and a droplet ejecting apparatus.

2. Related Art

In a technical field in which a thin piezoelectric device is capable of being produced and being driven at high speed, a piezoelectric actuator and an ink jet recording head are known, which are capable of being manufactured by a thin film technique. For example, JP-A-2000-326503 discloses an ink jet recording head that is capable of being manufactured by the thin film technique.

The ink jet recording head disclosed in JP-A-2000-326503 has a configuration in which a piezoelectric layer covers an upper surface and a side surface of a lower electrode of a piezoelectric device. Furthermore, in order to suppress oxidization of the lower electrode during a formation process of the piezoelectric layer, Pt is used as a material of the lower electrode.

In cases where an easily oxidizable material is used for the lower electrode, the lower electrode is oxidized during the formation process of the piezoelectric layer to cause volume expansion. Therefore, such a material may cause disadvantages such as separation of the lower electrode and generation of cracks. Accordingly, the material to be used for the lower electrode has been selected from limited types of materials.

SUMMARY

An advantage of some aspects of the invention is that it provides a piezoelectric device which enables an electrode material to be selected from various types of materials and that it provides a piezoelectric actuator, a droplet ejecting head, and a droplet ejecting apparatus each including such a piezoelectric device.

According to an aspect of the invention, there is provided a piezoelectric device including a first electrode layer provided so as to overlie a substrate, a second electrode layer disposed so as to face the first electrode layer, a piezoelectric layer disposed between the first electrode layer and the second electrode layer. The first electrode layer has a conductive layer and a barrier layer. The barrier layer is provided between the conductive layer and the piezoelectric layer so as to prevent the conductive layer from contacting the piezoelectric layer.

The term "overlie" is used herein to describe that, for example, a certain object (hereinafter referred to as an "object A") is formed so as to overlie another certain object (hereinafter referred to as an "object B"). In this case, the term "overlie" is used herein to include the case in which the object A directly overlies the object B and include the case in which the object A overlies the object B with another object therebetween. Similarly, the term "underlie" is used herein to include the case in which the object A directly underlies the object B and include the case in which the object A underlies the object B with another object therebetween.

In this advantage, the barrier layer is provided between the conductive layer and the piezoelectric layer in the first electrode layer so as to prevent the conductive layer from contacting the piezoelectric layer, thereby suppressing oxidization of the conductive layer. Accordingly, a material to be used for the conductive layer of the first electrode is capable of being selected from various types or materials.

It is preferable that the barrier layer may be formed so as to cover an upper surface and a side surface of the conductive layer.

In this advantage, the barrier layer is formed so as to cover an upper surface and a side surface of the conductive layer, so that an electrode material is capable of being selected from various types of materials.

It is preferable that the conductive layer may contain at least one component selected from the group consisting of W, Ta, Hf, Mo, Nb, Zr, Cu, Ni, Co, Fe, Cr, V, Ti, Ir, and Pd.

It is preferable that the barrier layer is formed with a nitride film having electrical conductivity.

By virtue of this advantage, the entire first electrode layer is capable of exhibiting reduced resistance.

It is preferable that the first electrode layer may include an adhesion layer between the substrate and the conductive layer and that the barrier layer may be formed so as to cover an side surface of the adhesion layer.

By virtue of this advantage, adherence between the substrate and the conductive layer is capable of being enhanced. Furthermore, oxidization of the adhesion layer is also capable of being prevented.

It is preferable that the first electrode layer may include an orientation layer between the barrier layer and the piezoelectric layer.

By virtue of this advantage, orientation of the piezoelectric layer is capable of being regulated.

According to another aspect of the invention, there is provided a piezoelectric actuator including the piezoelectric device having any of the above advantages.

By virtue of this advantage, the piezoelectric actuator is capable of being provided, which includes the piezoelectric device that enables an electrode material to be selected from various types of materials.

According to another aspect of the invention, there is provided a droplet ejecting head including the piezoelectric actuator having any of the above advantages.

By virtue of this advantage, the droplet ejecting head is capable of being provided, which includes the piezoelectric device that enables an electrode material to be selected from various types of materials.

According to another aspect of the invention, there is provided a droplet ejecting apparatus including the droplet ejecting head having any of the above advantages.

By virtue of this advantage, the droplet ejecting apparatus is capable of being provided, which includes the piezoelectric device that enables an electrode material to be selected from various types of materials.

BRIEF DESCRIPTION OF THE DRAWINGS

The invention will be described with reference to the accompanying drawings, wherein like numbers reference like elements.

DESCRIPTION OF EXEMPLARY EMBODIMENTS

Preferable embodiments of the invention will be hereinafter described with reference to the accompanying drawings. The embodiments to be hereinafter described should not be construed to unduly limit the scope of the invention. All of the configurations to be hereinafter described are not necessarily essential elements of the invention.

Figure 1:
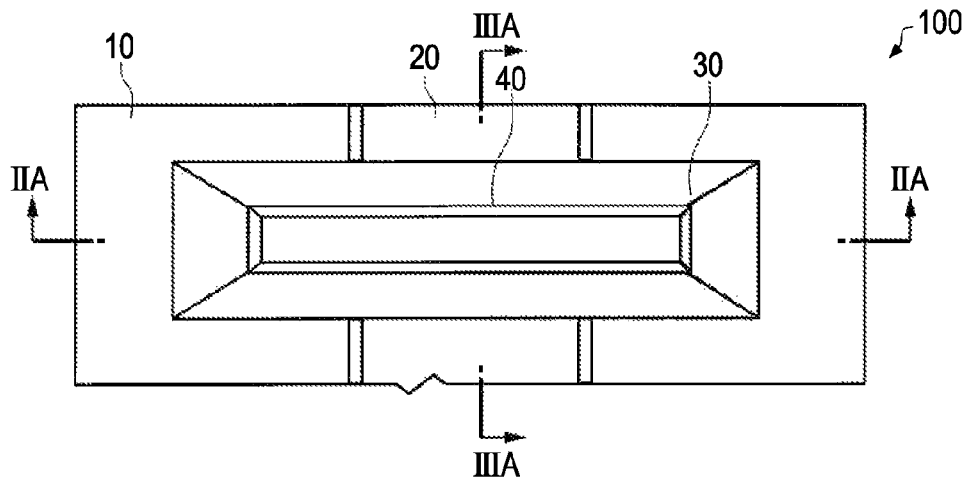
FIG. 1 is a plan view schematically illustrating a piezoelectric device according to an embodiment of the invention.
Figure 2A:
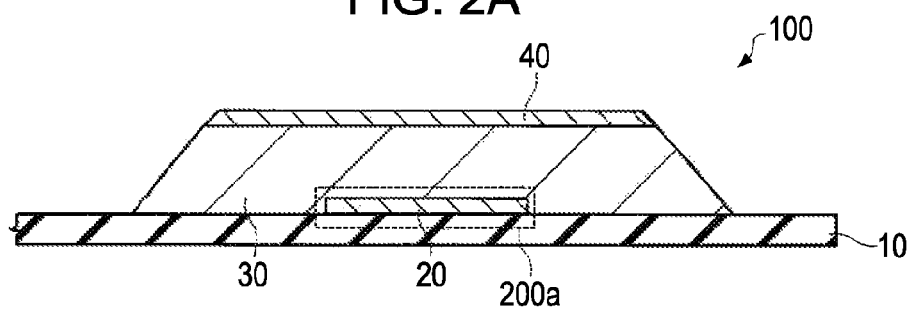
FIG. 2A is a cross-sectional view illustrating the piezoelectric device taken along a line IIA-IIA in FIG. 1.
Figure 2B:
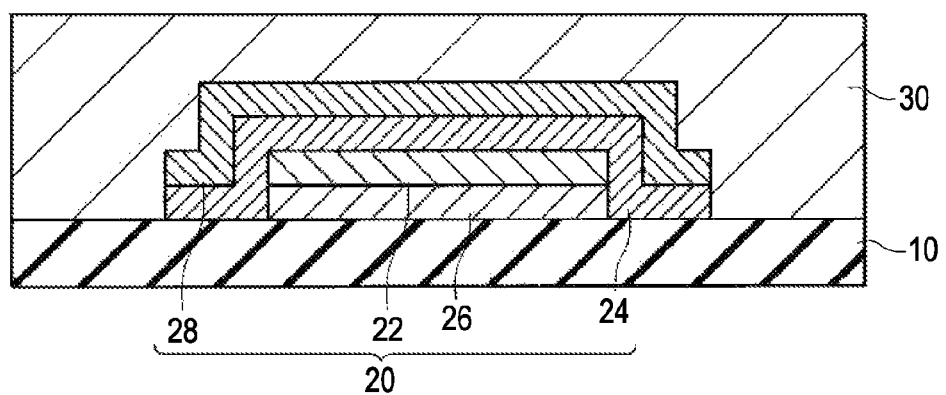
FIG. 2B illustrates part of the piezoelectric device in FIG. 2A in an enlarged manner.
Figure 3A:
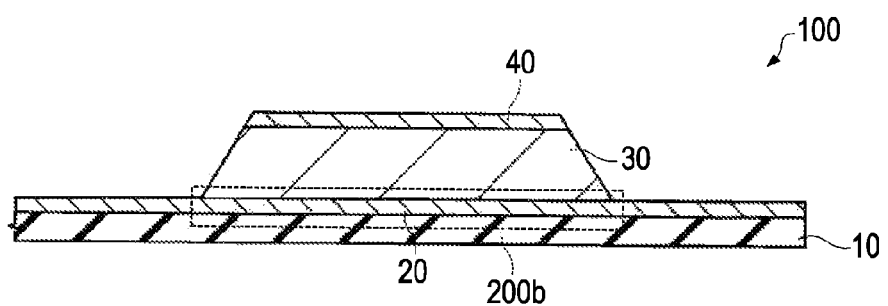
FIG. 3A is a cross-sectional view illustrating the piezoelectric device taken along a line IIIA-IIIA in FIG. 1.
Figure 3B:
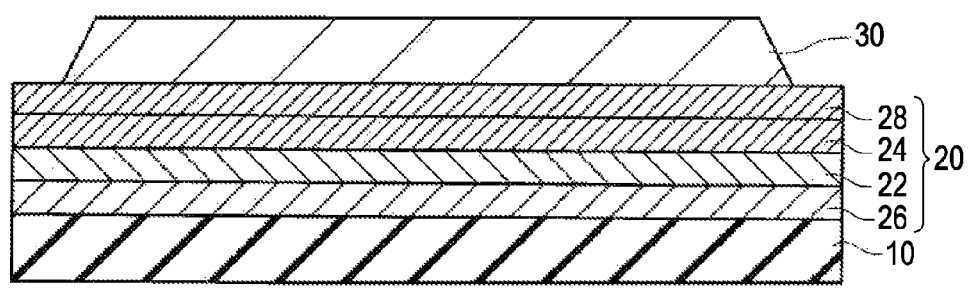
FIG. 3B illustrates part of the piezoelectric device in FIG. 3A in an enlarged manner.

1. Piezoelectric Device and Piezoelectric Actuator 1-1. Configuration of Piezoelectric Device and Piezoelectric Actuator FIG. 1 is a plan view schematically illustrating a piezoelectric device 100 according to an embodiment. FIG. 2A is a cross-sectional view illustrating the piezoelectric device 100 taken along a line IIA-IIA in FIG. 1. FIG. 2B illustrates a part 200a of the piezoelectric device 100 illustrated in FIG. 2A in an enlarged manner. FIG. 3A is a cross-sectional view illustrating the piezoelectric device 100 taken along a line IIIA-IIIA in FIG. 1. FIG. 3B illustrates a part 200b of the piezoelectric device 100 illustrated in FIG. 3A in an enlarged manner.

The piezoelectric device 100 of the embodiment includes a substrate 10, a first electrode layer 20, a piezoelectric layer 30, and a second electrode layer 40.

For example, the substrate 10 is capable of being formed using an electrical conductor, a semiconductor, and an insulator in the form of a flat plate. The substrate 10 may have a single-layer configuration or may have a configuration in which several layers are stacked. The inner configuration of the substrate 10 is not limited in so far as the upper surface of the substrate 10 has a planar shape. For example, the substrate 10 may have a configuration in which a space or the like is provided therein.

In cases where the substrate 10 functions as a vibrating plate of a piezoelectric actuator including the piezoelectric device 100, the substrate 10 plays a role in mechanical output during actuation of the piezoelectric device 100. For example, the substrate 10 may be configured so as to include a vibrating plate and may be therefore configured so as to be able to function as a movable portion of the piezoelectric actuator including the piezoelectric device 100. Furthermore, the substrate 10 may be configured as part of a wall of a pressure chamber of the like. The thickness of the substrate 10 is appropriately determined on the basis of the coefficient of elasticity or the like of the material to be used. In cases where the substrate 10 is the vibrating plate of the piezoelectric actuator including the piezoelectric device 100, the substrate 10 is capable of being configured so as to have a thickness in the range from 200 nm to 2000 nm. In cases where the substrate 10 has a thickness lower than 200 nm, mechanical output such as vibration may be difficult to be provided. In cases where the substrate 10 has a thickness larger than 2000 nm, vibration or the like may not occur. The substrate 10 is capable of being bent and vibrated in response to deformation of the piezoelectric layer 30.

In cases where the substrate 10 is the vibrating plate of the piezoelectric actuator including the piezoelectric device 100, the material of the substrate 10 preferably has high rigidity and mechanical strength. Examples of the material of the substrate 10 include an inorganic oxide such as a zirconium oxide, a silicon nitride, or a silicon oxide and include an alloy such as stainless steel. Among these, the zirconium oxide is especially preferable as the material of the substrate 10 in terms of chemical stability and rigidity. The substrate 10 may have a configuration in which layers containing two or more substances in the above example are stacked.

The first electrode layer 20 is formed so as to overlie the substrate 10. The first electrode layer 20 forms a pair with the second electrode layer 40 and functions as one of two electrodes that have the piezoelectric layer 30 interposed therebetween. For example, the first electrode layer 20 is capable of being configured so as to also function as a first conductive layer of an adjacent piezoelectric device that is provided so as to overlie the same substrate 10. The first electrode layer 20 is electrically connected to an external circuit (not illustrated).

The first electrode 20 has a conductive layer 22 and a barrier layer 24. Furthermore, the first electrode 20 may have an adhesion layer 26 and an orientation layer 28.

The conductive layer 22 is capable of being provided in the form of a layer or a thin film. One of the functions of the conductive layer 22 is that it imparts electrical conductivity to the first electrode layer 20.

An example of a material of the conductive layer 22 includes at least one metal selected from metals each having a melting point higher than or equal to a sintering temperature (for example, 800° C.) of the piezoelectric layer 30 and having high electrical conductivity (for example, exhibiting a resistivity less than or equal to 60 μΩ·cm). More specific examples of the material of the conductive layer 22 include one metal selected from the group consisting of W, Ta, Hf, Mo, Nb, Zr, Cu, Ni, Co, Fe, Cr, V, Ti, Ir, and Pd or an alloy containing one metal selected from the group.

The barrier layer 24 is provided between the conductive layer 22 and the piezoelectric layer 30 so as to prevent the conductive layer 22 from contacting the piezoelectric layer 30. The barrier layer 24 may be formed so as to cover an upper surface and a side surface of the conductive layer 22. For example, in the cross-sectional view of FIG. 2B, the barrier layer 24 is formed so as to cover the upper surface and the side surfaces of the conductive layer 22 to prevent the conductive layer 22 from contacting the piezoelectric layer 30. Furthermore, in the cross-sectional view of FIG. 3B, the barrier layer 24 is formed so as to cover an upper surface of the conductive layer 22 to prevent the conductive layer 22 from contacting the piezoelectric layer 30.

One of the functions of the barrier layer 24 is to prevent oxidization of the conductive layer 22. In addition, the barrier layer 24 may have electrical conductivity and may play a partial role in the electrical conductivity of the first electrode layer 20.

An example of the material of the barrier layer 24 includes a nitride film having electrical conductivity. More specific examples of the material of the barrier layer 24 include TiN, CrN, NbN, TaN, ZrN, TiAlN, TiCrN, TiZrN, TiHfN, TiNbN, and AlCrN.

As described above, in the piezoelectric device 100 according to the embodiment, the barrier layer 24 is provided between the conductive layer 22 and the piezoelectric layer 30 so as to prevent the conductive layer 22 from contacting the piezoelectric layer 30, thereby suppressing the oxidization of the conductive layer 22. Accordingly, the material to be used for the conductive layer 22 is capable of being selected from various types of materials.

The adhesion layer 26 is provided between the substrate 10 and the conductive layer 22. In each of the cross-sectional views of FIGS. 2B and 3B, the adhesion layer 26 is provided between the substrate 10 and the entire lower surface of the conductive layer 22. One of the functions of the adhesion layer 26 is that it enhances adherence between the substrate 10 and the conductive layer 22.

Examples of the material of the adhesion layer 26 include one metal selected from the group consisting of Ti, Cr, Ni, Ta, Zr, and W or an alloy containing one metal selected from the group.

In cases where the first electrode layer 20 has the adhesion layer 26, the barrier layer 24 may be configured so as to cover a side surface of the adhesion layer 26. In the cross-sectional view of FIG. 2B, the barrier layer 24 is configured so as to cover the side surfaces of the adhesion layer 26. Accordingly, oxidization of the adhesion layer 26 is also capable of being prevented.

The orientation layer 28 is provided between the barrier layer 24 and the piezoelectric layer 30. In each of the cross-sectional views of FIGS. 2B and 3B, the orientation layer 28 is provided between the upper surface of the barrier layer 24 and the piezoelectric layer 30. One of the functions of the orientation layer 28 is to regulate crystalline orientation of the piezoelectric layer 30 in a predetermined orientation.

An example of a material of the orientation layer 28 includes a perovskite oxide having electrical conductivity. More specifically, examples of the material of the orientation layer 28 include a lanthanum nickel oxide such as $LaNiO_3$, $La_2NiO_4$, $La_3Ni_2O_7$, $La_4Ni_3O_{10}$, and $La_3Ni_2O_6$; $ReO_3$; $SrReO_3$; $BaReO_3$; $LaTiO_3$; $LaAlO_3$; $SrVO_3$; $CaCrO_3$; $SrCr_3$; $SrFeO_3$; $La_{1-X}Sr_XC_0O_3$ (0<X<0.5); $CaRuO_3$; $SrRuO_3$; $SrTiO_3$; and $BaPbO_3$.

The piezoelectric layer 30 is disposed between the first electrode layer 20 and the second electrode layer 40. In each of the examples illustrated in FIGS. 1, 2A, and 3A, the piezoelectric layer 30 is provided so as to overlie the first electrode layer 20. Furthermore, the piezoelectric layer 30 is also provided so as to overlie the substrate 10 as illustrated in FIGS. 1 and 2B. The piezoelectric layer 30 is capable of being configured so as to have a thickness in the range from 400 nm to 1500 nm. In cases where the piezoelectric layer 30 has a thickness outside such a range, deformation of the piezoelectric layer 30 for sufficiently deforming the substrate 10 may not be achieved. An electrical voltage is applied to the piezoelectric layer 30 through the first electrode layer 20 and the second electrode layer 40 with the result that the piezoelectric layer 30 is shrunk and deformed, thereby bending and vibrating the substrate 10. A material having piezoelectric properties is capable of being used for the piezoelectric layer 30.

Preferably, an oxide having a perovskite crystal structure and represented by the general formula $ABO_3$ is used as the material of the piezoelectric layer 30. Specific examples of such a material include lead zirconate titanate [$Pb(Zr,Ti)O_3$] (hereinafter referred to as PZT, where appropriate), lead zirconate titanate niobate [$Pb(Zr,Ti,Nb)O_3$] (hereinafter referred to as PZTN, where appropriate), barium titanate ($BaTiO_3$), and potassium sodium niobate [$(K,Na)NbO_3$].

The second electrode layer 40 is disposed so as to face the first electrode layer 20. In each of the examples illustrated in FIGS. 1, 2A, and 3A, the second electrode layer 40 is provided so as to overlie the piezoelectric layer 30. The thickness of the second electrode layer 40 is not limited in so far as such a thickness does not adversely affect actuation of the piezoelectric layer 30. For example, the second electrode layer 40 is capable of being configured so as to have a thickness in the range from 20 nm to 200 nm. In cases where the second electrode layer 40 has a thickness smaller than 20 nm, electrical resistivity may be increased. In cases where the second electrode layer 40 has a thickness larger than 200 nm, the deformation of the piezoelectric layer 30 may be disturbed. The second electrode layer 40 forms a pair with the first electrode layer 20 to function as one of the two electrodes that have the piezoelectric layer 30 interposed therebetween.

The material of the second electrode layer 40 is not specifically limited in so far as the material has such an electrical conductivity that satisfies the above functions. Examples of the material of the second conductive layer 40 include metals such as Ni, Ir, Au, Pt, W, Ti, Ta, Mo, and Cr; an alloy of such metals; a conductive oxide of such metals (for example, an iridium oxide); a composite oxide of Sr and Ru; and a composite oxide of La and Ni. Furthermore, the second electrode layer 40 may have a single-layer structure made of the above materials or may have a structure in which several layers containing the above materials are stacked.

The substrate 10 is capable of being configured so as to include a vibrating plate, thereby providing a piezoelectric actuator including the piezoelectric device 100. Accordingly, a piezoelectric actuator is capable of being provided, which includes a piezoelectric device that enables an electrode material to be selected from various types of materials.

Figure 4:
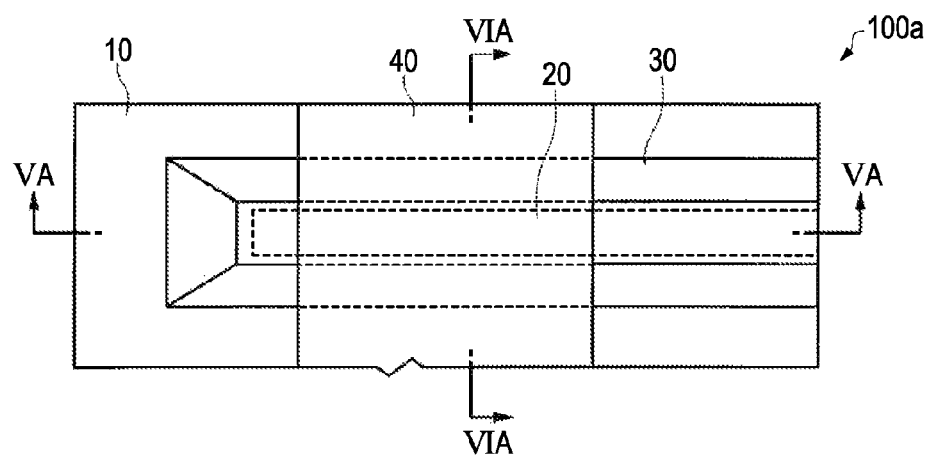
FIG. 4 is a plan view schematically illustrating a piezoelectric device of a modification.
Figure 5A:
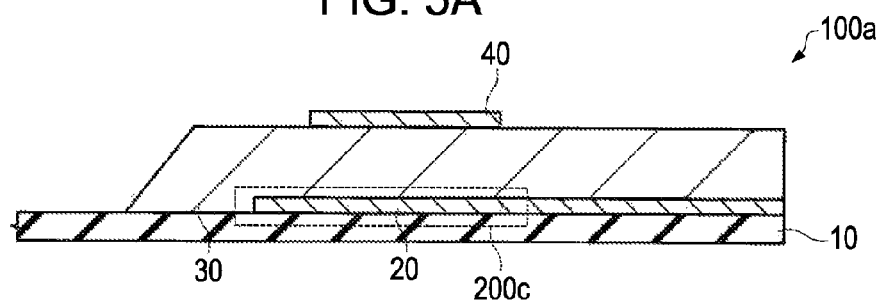
FIG. 5A is a cross-sectional view illustrating the piezoelectric device taken along a line VA-VA in FIG. 4.
Figure 5B:
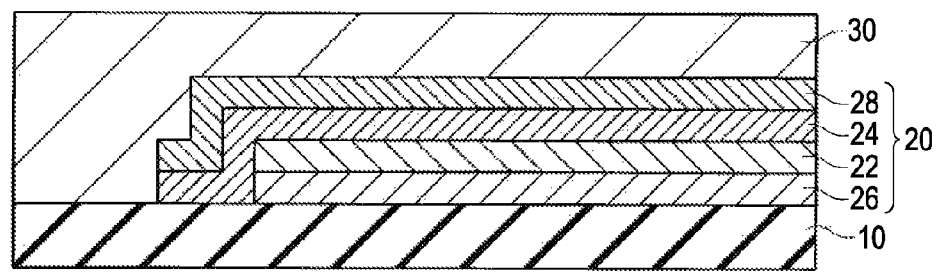
FIG. 5B illustrates part of the piezoelectric device in FIG. 5A in an enlarged manner.
Figure 6A:
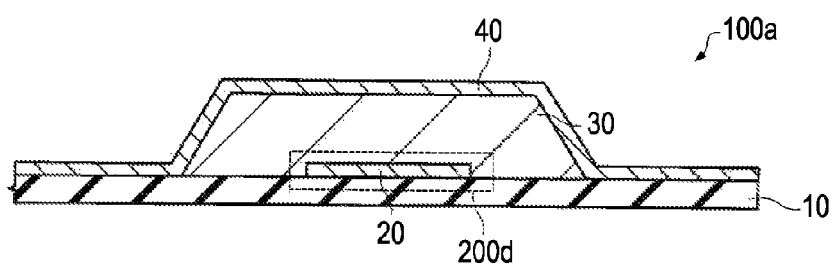
FIG. 6A is a cross-sectional view illustrating the piezoelectric device taken along a line VIA-VIA in FIG. 4.
Figure 6B:
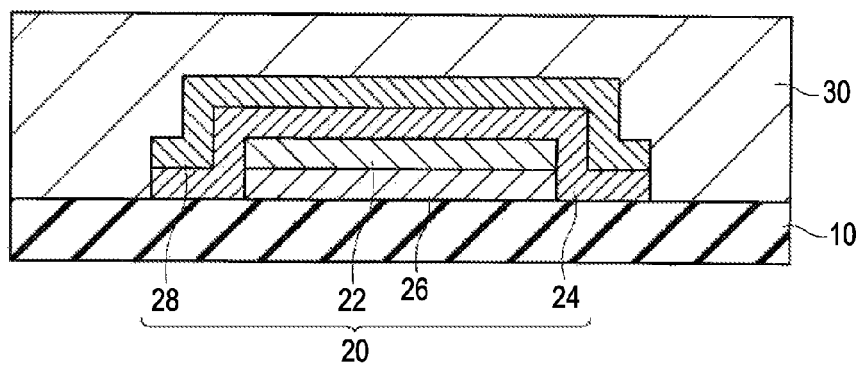
FIG. 6B illustrates part of the piezoelectric device in FIG. 6A in an enlarged manner.

1-2. Modification of Configuration of Piezoelectric Device and Piezoelectric Actuator FIG. 4 is a plan view schematically illustrating a piezoelectric device 100a of a modification. FIG. 5A is a cross-sectional view illustrating the piezoelectric device 100a taken along a line VA-VA in FIG. 4. FIG. 5B illustrates a part 200c of the piezoelectric device 100a illustrated in FIG. 5A in an enlarged manner. FIG. 6A is a cross-sectional view illustrating the piezoelectric device 100a taken along a line VIA-VIA in FIG. 4. FIG. 6B illustrates a part 200d of the piezoelectric device 100a illustrated in FIG. 6A in an enlarged manner. The difference between the piezoelectric device 100a and the piezoelectric device 100, which has been described with reference to FIGS. 1 to 3B, will be mainly described. The material and principle function of each component are the same as those in the piezoelectric device 100 that has been described with reference to FIGS. 1 to 3B.

The first electrode layer 20 is provided so as to overlie the substrate 10. The first electrode layer 20 forms a pair with the second electrode layer 40 to function as one of the two electrodes that have the piezoelectric layer 30 interposed therebetween. The first electrode layer 20 is electrically connected to an external circuit (not illustrated).

The first electrode layer 20 has a conductive layer 22 and a barrier layer 24. Furthermore, the first electrode layer 20 may have an adhesion layer 26 and an orientation layer 28.

The conductive layer 22 may be provided in the form of a layer or a thin film. One of the functions of the conductive layer 22 is to impart electrical conductivity to the first electrode layer 20.

The barrier layer 24 is provided between the conductive layer 22 and the piezoelectric layer 30 so as to prevent the conductive layer 22 from contacting the piezoelectric layer 30. The barrier layer 24 may be formed so as to cover an upper surface and a side surface of the conductive layer 22. For example, in the cross-sectional view of FIG. 5B, the barrier layer 24 is formed so as to cover the upper surface and the side surface of the conductive layer 22 to prevent the conductive layer 22 from contacting the piezoelectric layer 30. Furthermore, in the cross-sectional view of FIG. 6B, the barrier layer 24 is similarly formed so as to cover the upper surface and the side surfaces of the conductive layer 22.

As described above, in the piezoelectric device 100a according to the embodiment, the barrier layer 24 is provided between the conductive layer 22 and the piezoelectric layer 30 so as to prevent the conductive layer 22 from contacting the piezoelectric layer 30. Accordingly, the material to be used for the conductive layer 22 is capable of being selected from various types of materials.

The adhesion layer 26 is provided between the substrate 10 and the conductive layer 22. In each of the cross-sectional views of FIGS. 5B and 6B, the adhesion layer 26 is provided between the substrate 10 and the entire lower surface of the conductive layer 22.

In cases where the first electrode layer 20 has the adhesion layer 26, the barrier layer 24 is configured so as to cover a side surface of the adhesion layer 26. In the cross-sectional view of FIG. 5B, the barrier layer 24 is configured so as to cover the side surface of the adhesion layer 26. Furthermore, in the cross-sectional view of FIG. 6B, the barrier layer 24 is configured so as to cover the side surfaces of the adhesion layer 26. Accordingly, oxidization of the adhesion layer 26 is also capable of being prevented.

The orientation layer 28 is provided between the barrier layer 24 and the piezoelectric layer 30. In each of the cross-sectional views of FIGS. 5B and 6B, the orientation layer 28 is provided between the upper surface of the barrier layer 24 and the piezoelectric layer 30.

The piezoelectric layer 30 is disposed between the first electrode layer 20 and the second electrode layer 40. In each of the examples illustrated in FIGS. 4, 5A, and 6A, the piezoelectric layer 30 is provided so as to overlie the first electrode layer 20. Furthermore, the piezoelectric layer 30 is provided so as to also overlie the substrate 10 as illustrated in FIGS. 4, 5A, and 6A.

The second electrode layer 40 is disposed so as to face the first electrode layer 20. The second electrode layer 40 is provided so as to overlie the piezoelectric layer 30 as illustrated in each of FIGS. 4, 5A, and 6A. Furthermore, with reference to each of FIGS. 4, 5A, and 6A, the second electrode layer 40 is provided so as to also overlie the substrate 10. For example, the second electrode layer 40 is capable of being also configured so as to function as a second conductive layer of an adjacent piezoelectric device that is provided so as to overlie the same substrate 10.

The substrate 10 is capable of being configured so as to include a vibrating plate, thereby providing a piezoelectric actuator including the piezoelectric device 100a. Accordingly, a piezoelectric actuator is capable of being provided, which includes a piezoelectric device that enables an electrode material to be selected from various types of materials.

1-3. Manufacturing Method of Piezoelectric Device

A manufacturing method of the piezoelectric device 100 according to the embodiment will be described.

Figure 7A:
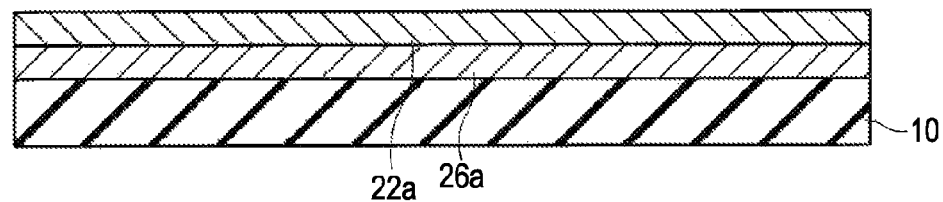
FIG. 7A is a cross-sectional view schematically illustrating a manufacturing process of the piezoelectric device according to the embodiment of the invention.
Figure 7B:
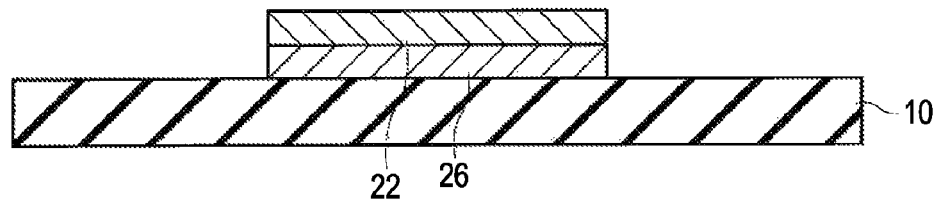
FIG. 7B is a cross-sectional view schematically illustrating a manufacturing process of the piezoelectric device according to the embodiment of the invention.
Figure 7C:
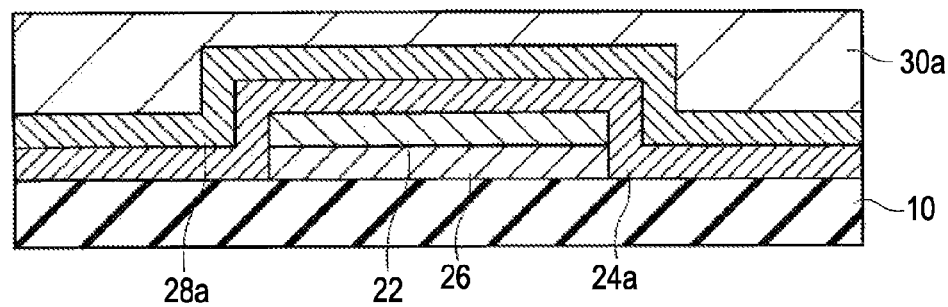
FIG. 7C is a cross-sectional view schematically illustrating a manufacturing process of the piezoelectric device according to the embodiment of the invention.
Figure 7D:
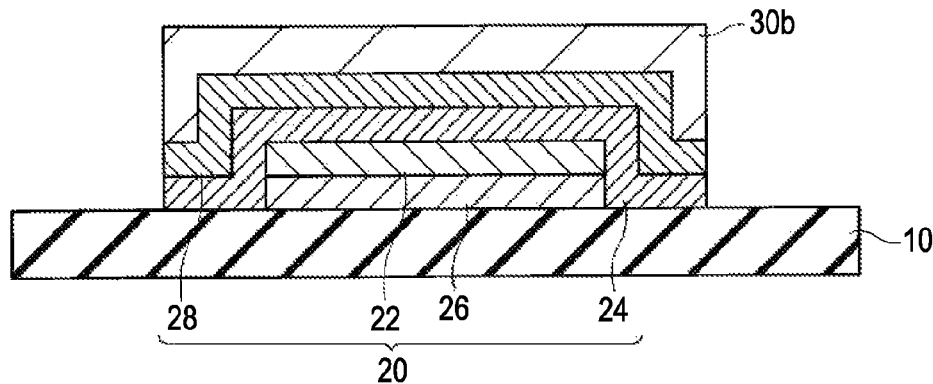
FIG. 7D is a cross-sectional view schematically illustrating a manufacturing process of the piezoelectric device according to the embodiment of the invention.
Figure 8A:
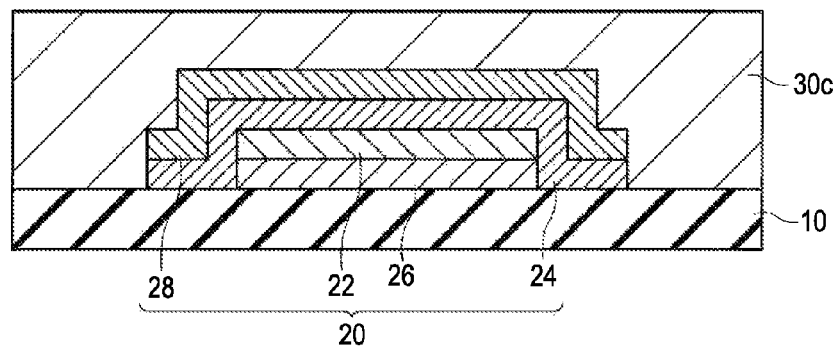
FIG. 8A is a cross-sectional view schematically illustrating a manufacturing process of the piezoelectric device according to the embodiment of the invention.
Figure 8B:
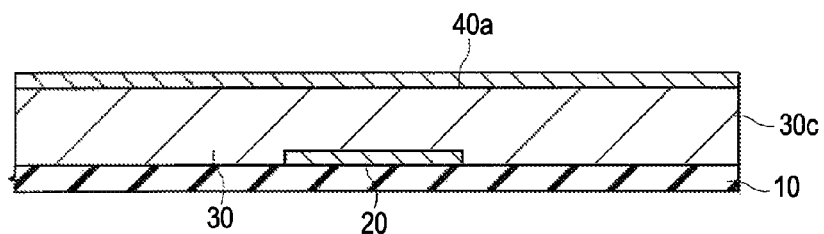
FIG. 8B is a cross-sectional view schematically illustrating a manufacturing process of the piezoelectric device according to the embodiment of the invention.
Figure 8C:
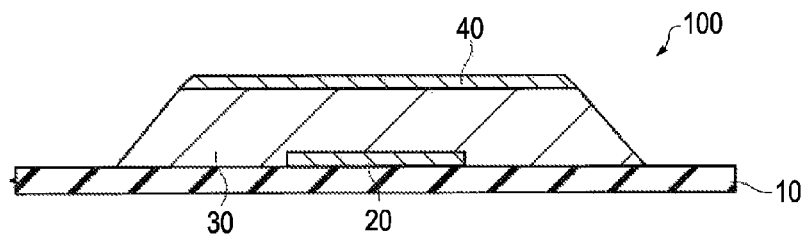
FIG. 8C is a cross-sectional view schematically illustrating a manufacturing process of the piezoelectric device according to the embodiment of the invention.

FIGS. 7A to 7D and 8A to 8C are cross-sectional views each schematically illustrating a manufacturing process of the piezoelectric device 100 according to the embodiment. FIGS. 7A to 7D and 8A each illustrate part of a cross-sectional surface corresponding to a portion taken along the line IIA-IIA in FIG. 1 in an enlarged manner. FIGS. 8B and 8C each illustrate a cross-sectional surface corresponding to a portion taken along the line IIA-IIA in FIG. 1 in an enlarged manner.

First, an adhesion layer 26a is formed so as to overlie the substrate 10 as illustrated in FIG. 7A. For example, the adhesion layer 26a is capable of being formed by a sputtering method, a vapor deposition method, a plating technique, or a printing method.

Subsequently, a conductive layer 22a is formed so as to overlie the adhesion layer 26a. For example, the conductive layer 22a is capable of being formed by the sputtering method, the vapor deposition method, the plating technique, or the printing method.

Subsequently, the adhesion layer 26a and the conductive layer 22a are patterned to form the adhesion layer 26 and the conductive layer 22 as illustrated in FIG. 7B. For example, unneeded portions of the adhesion layer 26a and the conductive layer 22a are etched by a photolithographic technique or the like, so that the adhesion layer 26a and the conductive layer 22a are patterned, thereby forming the adhesion layer 26 and the conductive layer 22.

Subsequently, a barrier layer 24a is formed so as to overlie the substrate 10 and the conductive layer 22 as illustrated in FIG. 7C. For example, the barrier layer 24a is capable of being formed by the sputtering method, the printing method, a chemical vapor deposition (CVD) method, or a metalorganic chemical vapor deposition (MOCVD) method.

Subsequently, an orientation layer 28a is formed so as to overlie the barrier layer 24a. For example, the orientation layer 28a is capable of being formed by the sputtering method, the vapor deposition method, the plating method, the printing method, the CVD method, or a sol-gel method.

Subsequently, a piezoelectric layer 30a is formed so as to overlie the orientation layer 28a. For example, the piezoelectric layer 30a is formed by the sol-gel method or the like. In the sol-gel method, a series of processes including application of slurry, preliminary heating, and annealing (calcination) for crystallization are performed. For example, an annealing temperature is capable of being set in the range from 550° C. to 900° C.

Subsequently, the barrier layer 24a, the orientation layer 28a, and the piezoelectric layer 30a are patterned to form the barrier layer 24, the orientation layer 28, and the piezoelectric layer 30b, respectively, as illustrated in FIG. 7D. For example, unneeded portions of the barrier layer 24a, the orientation layer 28a, and the piezoelectric layer 30a are etched by the photolithographic technique or the like, so that the barrier layer 24a, the orientation layer 28a, and the piezoelectric layer 30a are patterned, thereby respectively forming the barrier layer 24, the orientation layer 28, and the piezoelectric layer 30b. With these processes, the first electrode layer 20 is formed.

Subsequently, a piezoelectric layer 30c is formed so as to be integrated with the piezoelectric layer 30b as illustrated in FIG. 8A. For example, in the sol-gel method, a series of processes including application of slurry, preliminary heating, and annealing (calcination) for crystallization are performed, thereby forming the piezoelectric layer 30c so as to be integrated with the piezoelectric layer 30b.

Subsequently, a second conductive layer 40a is formed so as to overlie the piezoelectric layer 30c as illustrated in FIG. 8B. For example, the second conductive layer 40a is capable of being formed by the sputtering method, the vapor deposition method, or the CVD method.

Subsequently, as illustrated in FIG. 8C, the second conductive layer 40a and the piezoelectric layer 30c are patterned, thereby forming the piezoelectric device 100 having a capacitor structure including the first electrode layer 20, the piezoelectric layer 30, and the second conductive layer 40. For example, unneeded portions of the second conductive layer 40a and the piezoelectric layer 30c are etched by the photolithographic technique or the like, so that the second conductive layer 40a and the piezoelectric layer 30c are patterned.

Although the piezoelectric device 100 is formed in this manner, in the manufacturing method according to the embodiment, other processes, such as a manufacturing process of another component and a surface preparation process, can be interposed between individual processes of the manufacturing method.

Meanwhile, although the piezoelectric device 100 according to the embodiment has been described as an example, the piezoelectric device 100a according to the modification is also capable of being manufactured with the same method.

2. Droplet Ejecting Head

Figure 9:
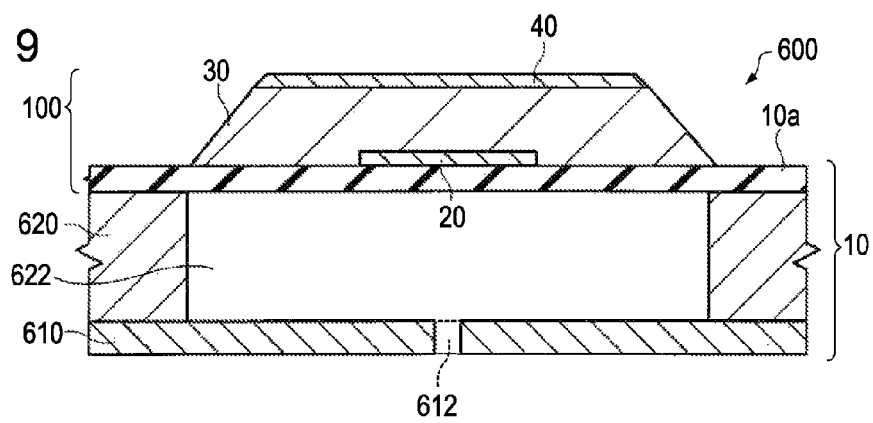
FIG. 9 is a cross-sectional view schematically illustrating part of a droplet ejecting head according to an embodiment of the invention.
Figure 10:
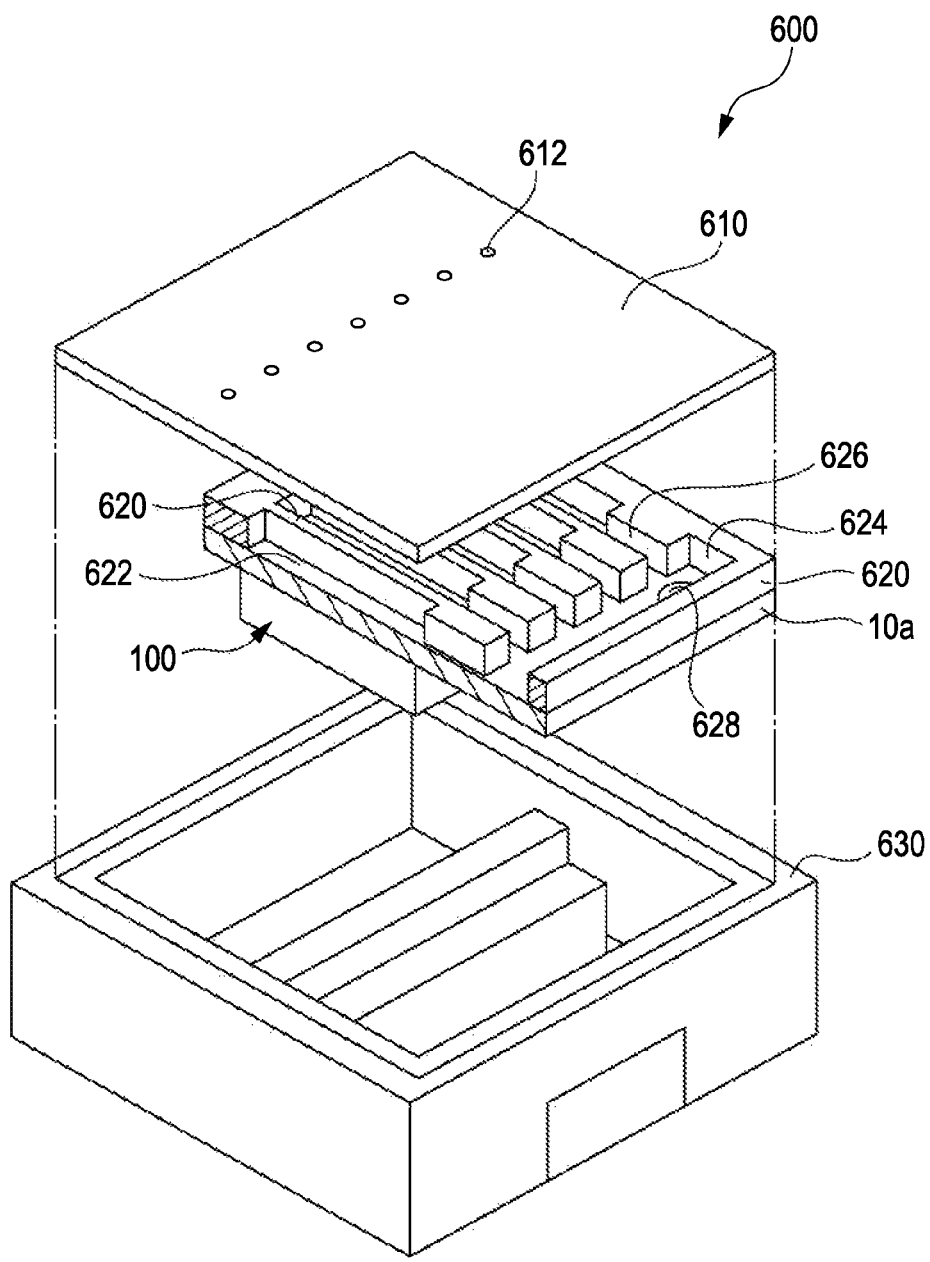
FIG. 10 is an exploded perspective view illustrating the droplet ejecting head according to the embodiment of the invention.

A droplet ejecting head 600 in which the piezoelectric device 100 according to the embodiment functions as a piezoelectric actuator will be described with reference to the accompanying drawings. FIG. 9 is a cross-sectional view schematically illustrating part of the droplet ejecting head 600 according to an embodiment. FIG. 10 is an exploded perspective view illustrating the droplet ejecting head 600 according to the embodiment, and the droplet ejecting head 600 is illustrated upside down relative to a normal use situation.

The droplet ejecting head 600 is capable of including the above piezoelectric device (piezoelectric actuator). In the following example, the liquid ejecting head 600 will be described, which is formed so as to have a structure including the vibrating plate 10a provided at an upper portion of the substrate 10 and in which the piezoelectric device 100 functions as a piezoelectric actuator.

With reference to FIGS. 9 and 10, the droplet ejecting head 600 includes a nozzle plate 610 having a nozzle hole 612, a pressure chamber substrate 620 that serves to form a pressure chamber 622, and the piezoelectric device 100. Furthermore, the liquid ejecting head 600 may have a housing 630 as illustrated in FIG. 10. FIG. 10 illustrates simplified piezoelectric device 100.

With reference to FIGS. 9 and 10, the nozzle plate 610 has the nozzle hole 612. The nozzle hole 612 is capable of ejecting droplets of liquid such as ink (not only liquid but also including various functional materials that are prepared with a solvent or a dispersion medium so as to have appropriate viscosity or including a substance containing metal flakes or the like, and the same is applied hereafter). For example, a plurality of the nozzle holes 612 are formed on the nozzle plate 610 in line. Examples of a material of the nozzle plate 610 include silicon and steel used stainless (SUS).

The pressure chamber substrate 620 is disposed so as to overlie the nozzle plate 610 (underlying the nozzle plate 610, in FIG. 10). An example of a material of the pressure chamber substrate 620 includes silicon. The pressure chamber substrate 620 defines a space between the nozzle plate 610 and the vibrating plate 10a, and therefore the droplet ejecting head 600 is provided with a reservoir (liquid reserving section) 624, a feed opening 626 connected to the reservoir 624, and the pressure chamber 622 connected to the feed opening 626 as illustrated in FIG. 10. The reservoir 624, the feed opening 626, and the pressure chamber 622 are flow channels of the liquid. Although the flow channels are individually described in this embodiment, they may be designed in any manner. In addition, for example, although part of the flow channels is narrowed to form the feed opening 626 in the illustration, such a configuration is not indispensable. The feed opening 626 may be formed on the basis of an appropriate design. The reservoir 624, the feed opening 626, and the pressure chamber 622 are defined by the nozzle plate 610, the pressure chamber substrate 620, and the vibrating plate 10a. The reservoir 624 is capable of temporarily reserving ink supplied from the outside (an ink cartridge, for example) through a thorough-hole 628 formed on the vibrating plate 10a. The ink inside the reservoir 624 is capable of being supplied to the pressure chamber 622 through the feed opening 626. The vibrating plate 10a is deformed, and therefore volume of the pressure chamber 622 is changed. The pressure chamber 622 is connected to the nozzle hole 612. The volume change in the pressure chamber 622 enables the liquid to be ejected from the nozzle hole 612.

The piezoelectric device 100 is disposed so as to overlie the pressure chamber substrate 620 (underlying the pressure chamber substrate 620, in FIG. 10). The piezoelectric device 100 is capable of being electrically connected to a driving circuit (not illustrated) for the piezoelectric device to be worked (vibrated and deformed) on the basis of a signal transmitted from the driving circuit. The vibrating plate 10a is deformed depending on the action of the stacking structure (piezoelectric layer 30) and therefore is capable of appropriately changing inner pressure of the pressure chamber 622.

With reference to FIG. 10, the housing 630 is capable of accommodating the nozzle plate 610, the pressure chamber substrate 620, and the piezoelectric device 100. Examples of a material of the housing 630 include a resin and metal.

The droplet ejecting head 600 includes the above piezoelectric actuator that enables an electrode material to be selected from various types of materials. Accordingly a droplet ejecting head including the piezoelectric device that enables the electrode material to be selected from various types of materials is capable of being provided.

In this embodiment, the droplet ejecting head 600 as an ink jet recording head has been described. However, the droplet ejecting head according to an aspect of the invention may be applied to, for example, a color material ejecting head used for manufacturing a color filter of a liquid crystal display or the like, an electrode material ejecting head used for forming an electrode of an organic electro-luminescence (EL) display and a field emission display (FED), a living-organic material ejecting head used for manufacturing a biochip.

3. Droplet Ejecting Apparatus

Figure 11:
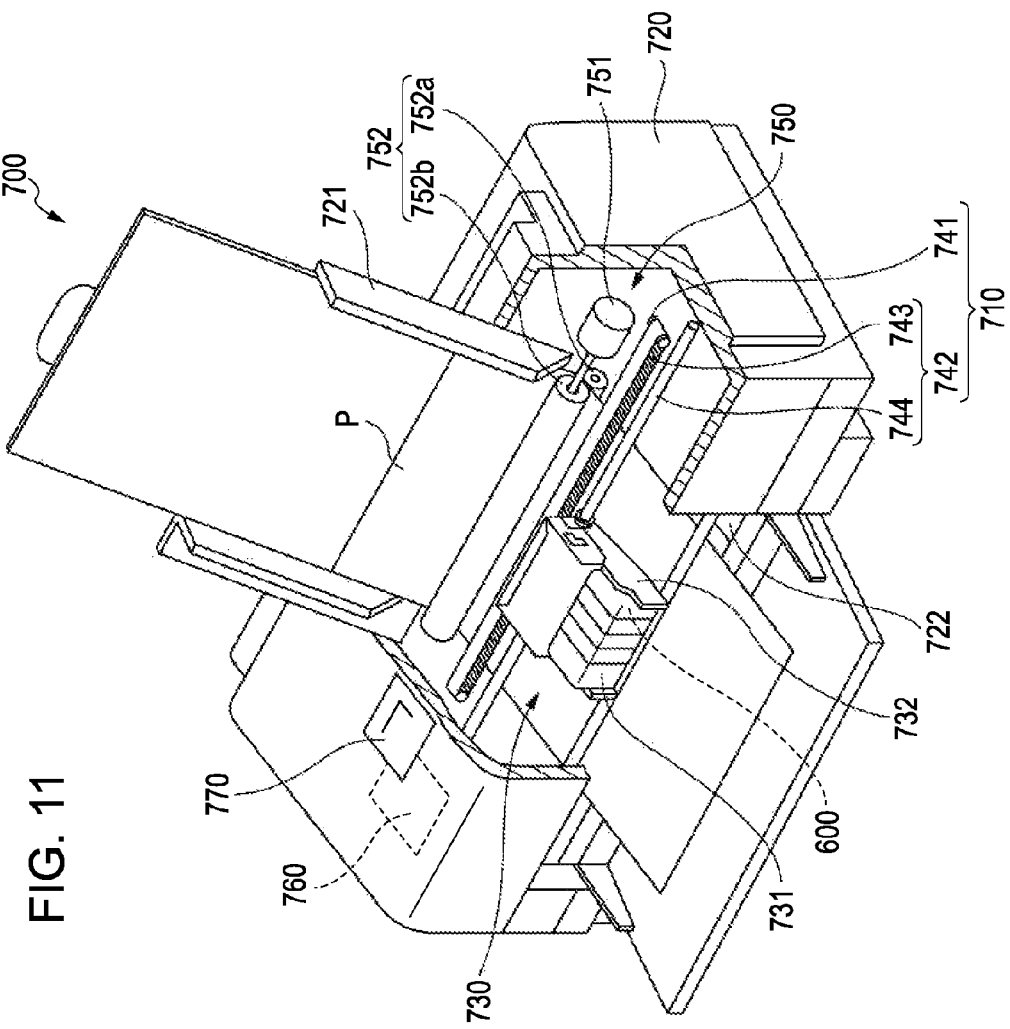
FIG. 11 is a perspective view schematically illustrating a droplet ejecting apparatus according to an embodiment of the invention.

A droplet ejecting apparatus according to an embodiment will be described with reference to the accompanying drawing. The droplet ejecting apparatus has the above droplet ejecting head. The droplet ejecting apparatus as an ink jet printer having the above droplet ejecting head will be hereinafter described. FIG. 11 is a perspective view schematically illustrating a droplet ejecting apparatus 700 according to the embodiment.

With reference to FIG. 11, the droplet ejecting apparatus 700 includes a head unit 730, a driving section 710, and a control section 760. Furthermore, the droplet ejecting apparatus 700 is capable of including an apparatus body 720, a paper feed section 750, a paper feed tray 721 on which recording paper P is placed, an ejection opening 722 through which the recording paper P is ejected, and an operation panel 770 disposed at an upper surface of the apparatus body 720.

The head unit 730 has an ink jet recording head (hereinafter referred to as "head", simply) including the droplet ejecting head 600. Furthermore, the head unit 730 has an ink cartridge 731 which supplies ink to the head and has a transporting unit (carriage) 732 on which the head and the ink cartridge 731 are mounted.

The driving section 710 enables the head unit 730 to be reciprocated. The driving section 710 has a carriage motor 741 that is a driving source of the head unit 730 and has a reciprocating mechanism 742 that reciprocates the head unit 730 by receiving the rotation of the carriage motor 741.

The reciprocating mechanism 742 includes a carriage guide shaft 744 of which two ends are supported by a frame (not illustrated) and includes a timing belt 743 extending in parallel with the carriage guide shaft 744. The carriage 732 is supported by the carriage guide shaft 744 so as to be able to be reciprocated. Furthermore, the carriage 732 is fixed to part of the timing belt 743. The carriage motor 741 is operated to work the timing belt 743, and therefore the head unit 730 is reciprocated while being guided by the carriage guide shaft 744. During the reciprocation, ink is appropriately ejected from the head to perform printing to the recording paper P.

In the embodiment, although printing is performed while the droplet ejecting head 600 and the recording paper P are moved, the droplet ejecting apparatus according to an aspect of the invention may have a configuration in which printing is performed to the recording paper P while the droplet ejecting head 600 and the recording paper P relatively change positions each other. Furthermore, in the embodiment, although printing is performed to the recording paper P, a recording medium to which printing is capable of being performed by the droplet ejecting apparatus according to an aspect of the invention is not limited to paper. Examples of such a medium variously include cloth, a film, and metal, and the configuration of the apparatus may be appropriately changed.

The control section 760 is capable of controlling the head unit 730, the driving section 710, and the paper feed section 750.

The paper feed section 750 is capable of transporting the recording paper P from the paper feed tray 721 toward the head unit 730. The paper feed section 750 includes a paper feed motor 751 that is a driving source thereof and includes a paper feed roller 752 that rotates by the operation of the paper feed motor 751. The paper feed roller 752 includes a driven roller 752a and a driving roller 752b, and the driving roller 752b is disposed above the driven roller 752a so as to face each other while a transport path of the recording paper P is interposed therebetween. The driving roller 752b is connected to the paper feed motor 751. The control section 760 drives the paper feed section 750, and then the recording paper P is transported so as to pass below the head unit 730.

The head unit 730, the driving section 710, the control section 760, and the paper feed section 750 are provided inside the apparatus body 720.

The droplet ejecting apparatus 700 includes the above droplet ejecting head that enables an electrode material to be selected from various types of materials. Accordingly, a droplet ejecting apparatus is capable of being provided, which includes the piezoelectric device that enables the electrode material to be selected from various types of materials.

The above exemplified droplet ejecting apparatus has a single droplet ejecting head, and printing is capable of being performed to a recording medium by the droplet ejecting head, but the apparatus may include a plurality of the droplet ejecting heads. In cases where the droplet ejecting apparatus includes the plurality of the droplet ejecting heads, the droplet ejecting heads may be individually operated in the above manner, or the droplet ejecting heads may be connected to each other to form an integrated head. An example of such an integrated head includes a line-type head in which each nozzle hole of the heads is overall positioned so as to be spaced at a uniform distance.

Although the ink jet recording apparatus 700 as an ink jet printer has been described as an example of the droplet ejecting apparatus according to an aspect of the invention, the droplet ejecting apparatus according to the aspect of the invention may be also applied to industrial use. In this case, various functional materials that are prepared with a solvent or a dispersion medium so as to have appropriate viscosity may be used as liquid or the like (liquid material) to be ejected. The droplet ejecting apparatus according to an aspect of the invention is capable of being preferably applied not only to the exemplified image recording apparatus, such as a printer, but also to a color material ejecting apparatus used for manufacturing a color filter of a liquid crystal display or the like; a liquid material ejecting apparatus used for forming an electrode and a color filter of an organic EL display, a FED, and an electrophoretic display; and a living-organic material ejecting apparatus used for manufacturing a biochip.

The above embodiments and various modifications are merely examples, and embodiments of the invention are not limited to the above. For example, a plurality of the embodiments and modifications are capable of being appropriately combined.

Embodiments of the invention are not limited to the above embodiments and are capable of being variously modified. For example, embodiments of the invention include configurations substantially the same as those described in the above embodiments (for example, configurations having the same functions, processes, and results or having the same objects and advantageous effects as those in the above embodiments). In addition, embodiments of the invention may include configurations provided by changing non-essential parts of the configurations described in the above embodiments. Furthermore, embodiments of the invention may include configurations that are capable of providing the same effects as those described in the above embodiments or that are capable of providing the same advantages as those in the above embodiments. Still furthermore, embodiments of the invention may include configurations in which at least one well-known technique is added to the configurations described in the above embodiments.

What is claimed is:

1. A piezoelectric device comprising:
a first electrode layer provided so as to overlie a substrate;
a second electrode layer disposed so as to face the first electrode layer; and
a piezoelectric layer disposed between the first electrode layer and the second electrode layer, wherein
the first electrode layer includes a conductive layer and a conductive barrier layer, wherein
the barrier layer is provided between the conductive layer and the piezoelectric layer so as to prevent the conductive layer from contacting the piezoelectric layer, wherein the barrier layer contacts and covers an upper surface of the conductive layer and extends from the upper surface to the substrate along a side surface of the conductive layer.

2. The piezoelectric device according to claim 1, wherein the conductive layer contains at least one component selected from the group consisting of W, Ta, Hf, Mo, Nb, Zr, Cu, Ni, Co, Fe, Cr, V, Ti, Ir, and Pd.

3. The piezoelectric device according to claim 1, wherein the barrier layer is formed with a nitride film having electrical conductivity.

4. The piezoelectric device according to claim 1, wherein
the first electrode layer has an adhesion layer between the substrate and the conductive layer, and
the barrier layer is formed so as to cover a side surface of the adhesion layer.

5. The piezoelectric device according to claim 1, wherein the first electrode layer has an orientation layer between the barrier layer and the piezoelectric layer.

6. A piezoelectric actuator comprising:
a piezoelectric device that includes:
a first electrode layer provided so as to overlie a substrate;
a second electrode layer disposed so as to face the first electrode layer; and
a piezoelectric layer disposed between the first electrode layer and the second electrode layer, wherein
the first electrode layer includes a conductive layer and a conductive barrier layer, wherein
the barrier layer is provided between the conductive layer and the piezoelectric layer so as to prevent the conductive layer from contacting the piezoelectric layer, wherein the barrier layer contacts and covers an upper surface of the conductive layer and extends from the upper surface to the substrate along a side surface of the conductive layer.

7. The piezoelectric actuator according to claim 6, wherein the conductive layer contains at least one component selected from the group consisting of W, Ta, Hf, Mo, Nb, Zr, Cu, Ni, Co, Fe, Cr, V, Ti, Ir, and Pd.

8. The piezoelectric actuator according to claim 6, wherein the barrier layer is formed with a nitride film having electrical conductivity.

9. The piezoelectric actuator according to claim 6, wherein
the first electrode layer has an adhesion layer between the substrate and the conductive layer, and
the barrier layer is formed so as to cover a side surface of the adhesion layer.

10. The piezoelectric actuator according to claim 6, wherein the first electrode layer has an orientation layer between the barrier layer and the piezoelectric layer.

11. A droplet ejecting head comprising the piezoelectric actuator according to claim 6.

12. A droplet ejecting apparatus comprising the droplet ejecting head according to claim 11.

* * * * *